United States Patent [19]

Maruo

[11] 4,053,829
[45] Oct. 11, 1977

[54] APPARATUS FOR DETECTING THE DIRECTION OF A MAGNETIC FIELD TO SENSE THE POSITION OF, FOR EXAMPLE, A ROTARY ELEMENT OR THE LIKE

[75] Inventor: Tsunehiro Maruo, Yokohama, Japan

[73] Assignee: Sony Corporation, Tokyo, Japan

[21] Appl. No.: 597,818

[22] Filed: July 21, 1975

[30] Foreign Application Priority Data

July 31, 1974 Japan .................................. 49-87732

[51] Int. Cl.² ............................................ G01R 33/06
[52] U.S. Cl. ................................... 324/46; 33/363 R;
338/32 R; 324/34 D
[58] Field of Search ............... 324/45, 46, 34 P, 34 D;
338/32 R, 32 H; 323/94 R, 94 H; 360/113;
33/355, 363

[56] References Cited

U.S. PATENT DOCUMENTS

| 3,162,805 | 12/1964 | Robertson | 324/45 |
| 3,405,355 | 10/1968 | Hebbert | 324/46 |
| 3,546,579 | 12/1970 | Paul et al. | 324/46 |
| 3,928,836 | 12/1975 | Makino | 324/46 |

OTHER PUBLICATIONS

Hebbert et al., Thin Film Magneto resistance Magnetometer, Rev. of Sci. Inst., vol. 37, No. 10, Oct. 1966, pp. 1321-1323.

Primary Examiner—Robert J. Corcoran
Attorney, Agent, or Firm—Lewis H. Eslinger; Alvin Sinderbrand

[57] ABSTRACT

Apparatus for detecting the direction of a magnetic field includes a magnetoresistive device comprising an insulating substrate, first and second ferromagnetic metal film strips on the substrate for providing first and second main current conducting paths respectively perpendicular to each other, the ends of the strips being connected together to form an output terminal and having current input terminals connected to the opposed ends of the strips. A stationary bias magnet is disposed adjacent the magnetoresistive device for supplying a bias flux at a predetermined angle relative to a main current conducting path.

In one application of this apparatus, the magnetic field is supplied from, for example, a magnet, such as a rotary magnet, thereby to apply, with the bias flux, a composite flux to the magnetoresistive device. An output signal is derived from the output terminal that is a function of the direction in which the magnetic field is supplied.

17 Claims, 15 Drawing Figures

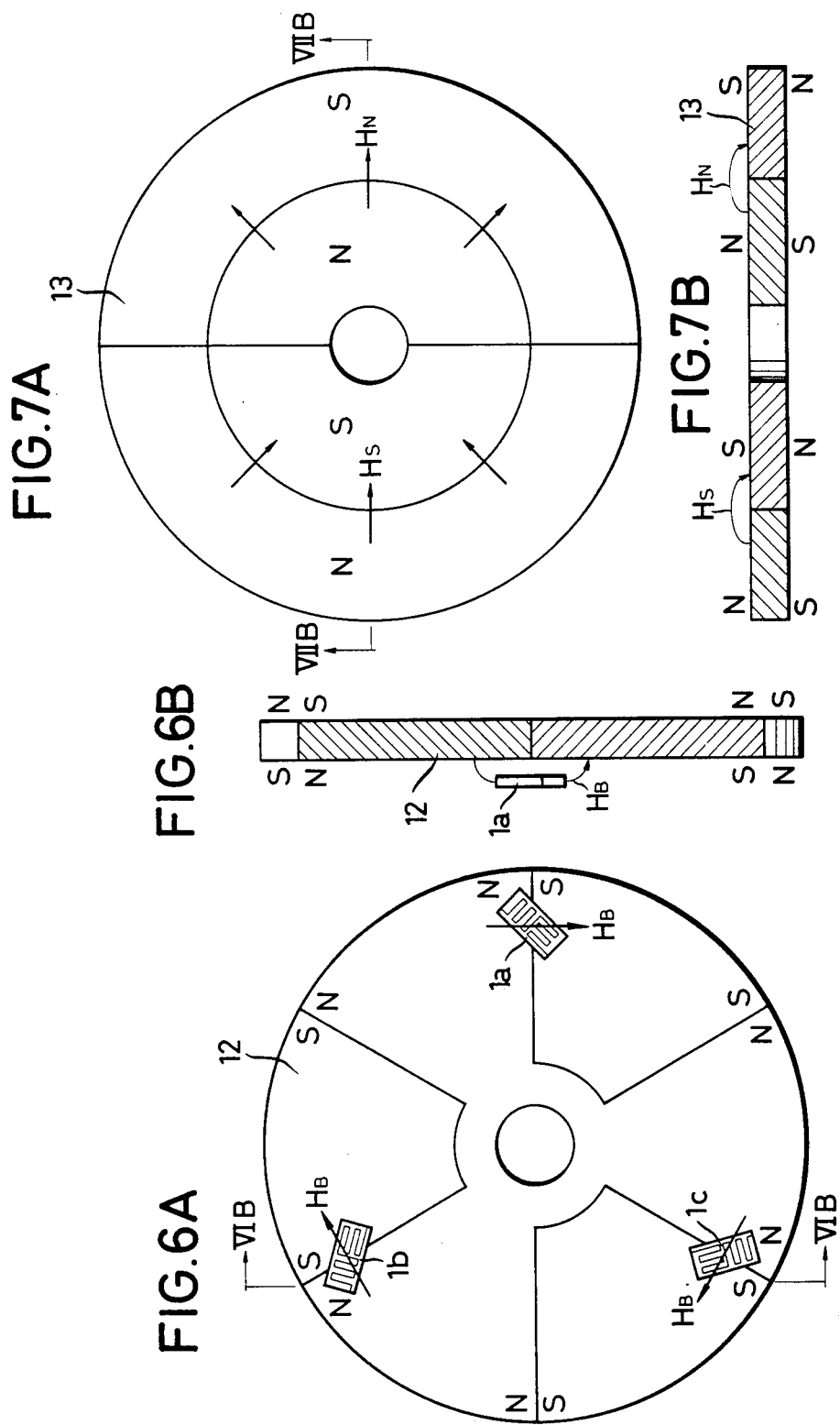

APPARATUS FOR DETECTING THE DIRECTION OF A MAGNETIC FIELD TO SENSE THE POSITION OF, FOR EXAMPLE, A ROTARY ELEMENT OR THE LIKE

BACKGROUND OF THE INVENTION

This invention relates to apparatus for detecting the direction of a magnetic field and, more particularly, to a magnetoresistive device suitable for detecting angular positions of a rotary element and having ready application in detecting the position of a rotor.

It is a common practice to detect angular positions of a rotor of an electric motor, such as a brushless electric motor, to thereby effect speed and position control. As typical examples, position detectors of this type are used in turntable devices, magnetic recording devices VTR apparatus and the like to attain a high degree of speed and position control of the rotating elements. Other uses are found as, for example, a brushless motor tachometer.

In brushless motor applications, the rotor position can be sensed by a magnetoelectric transducer in order to control the currents flowing into the stator coil of the motor. The magnetoelectric transducer may, for example, be constituted by a semiconductor transducer, such as a semiconductor Hall device, a semiconductor magnetoresistive element or a planar Hall element. Alternatively, the magnetoelectric transducer may be constituted by a ferromagnetic transducer, such as a ferromagnetic magnetoresistive element.

The temperature characteristics of a semiconductor transducer have undesirable effects, since the number and the mobility of the charge carriers vary widely with temperature. Accordingly, when such semiconductor transducers are used, a temperature compensating device is generally required. Moreover, the output signal produced by the semiconductor transducer is dependent upon and thus varies with the intensity of the magnetic field which is sensed. Consequently, if the semiconductor transducer is used as a switching element for detecting the direction of the magnetic field, for example, in brushless motor, additional circuitry must be employed to improve the accuracy of the transducer output and to effect a limiting operation so as to minimize the effects due to field intensity variation. These circuits which must be used to correct and compensate the semiconductor transducers are expensive and complex.

The ferromagnetic transducer, on the other hand, has a temperature characteristic which does not result in the undesirable effects noted above, because the resistivity of the ferromagnetic transducer varies only slightly with temperature. Moreover, when the ferromagnetic transducer is saturated with a magnetic field, the output is relatively insensitive to variations in the intensity of the magnetic field, and thus a self-limiting operation is effected. Consequently, the ferromagnetic transducer is more advantageous for use as a switching element than the semiconductor transducer when the direction of the magnetic field is to be detected. The planar Hall element suffers from the disadvantage that its output voltage is of very low amplitude and thus requires the use of a high gain amplifier to provide necessary voltage amplification. A conventional magnetoresistive element having two terminals has the disadvantage that the unbalanced voltage which is produced in the absence of an applied magnetic field is several orders of magnitude as high as the output voltage which is produced when a magnetic field is detected, although the output voltage is considerably high. Also, drift due to variations in temperature must be compensated.

Some of the aforenoted problems attending the measurement and detection of magnetic fields have been avoided by recently proposed devices. One such proposal is described in U.S. Pat. No. 3,405,355 to Hebbert, which discloses a magnetometer employing thin film magnetic films having magnetoresistive properties. The relationship between the resistivity of the thin film material and the angle of rotation of the magnetization in the film is used to measure external magnetic fields. When a biasing field is applied to the magnetoresistive films, fields of high intensity can be measured.

Another proposal is described in copending Application Ser. No. 487,282, filed July 10, 1974, now U.S. Pat. No. 3,928,836 issued Dec. 23, 1975 and assigned to the same assignee of the present invention. In the copending application a magnetoresistive element is provided wherein ferromagnetic metal film strips are disposed in mutually perpendicular configuration on an insulating substrate so that current flows through these series-connected strips in directions which are predominantly perpendicular to each other. These perpendicular strips may be formed on the same side or on opposite sides of the substrate.

The present invention utilizes the basic teachings of the aforedescribed copending application to attain improved results not heretofore achieved by any of the prior art proposals.

OBJECTS OF THE INVENTION

Therefore, it is one object of the present invention to provide an improved detector for detecting the direction of a magnetic field.

It is another object of this invention to provide a magnetic field detector which exhibits the advantages of conventional magnetoresistive elements, but without the aforenoted disadvantages.

A further object of the present invention is to provide an improved magnetic field detector comprised of a magnetoresistive element wherein a relatively large change in the output voltage is produced in response to a change in the direction of the magnetic field.

Yet another object of this invention is to provide a magnetic field detector having a magnetoresistive element which is readily adapted to perform a switching function and thus is useful in detecting the angular positions of a rotary element.

A still further object of this invention is to provide apparatus for detecting the direction of a magnetic field, the apparatus including a magnetoresistive element in combination with a bias magnet.

An additional object of the present invention is to provide an improved magnetic field detector capable of producing an output which varies as a function of the direction of the magnetic field, which is relatively insensitive to the intensity of the detected field and which is substantially unaffected by temperature changes.

Various other objects and advantages of the present invention will become apparent from the ensuing detailed description, and the novel features will be particularly pointed out in the appended claims.

SUMMARY OF THE INVENTION

In accordance with the present invention, a magnetic field direction is detected by a magnetoresistive device which comprises a stationary bias magnet magnetized in the direction of its thickness so that the pole faces of the magnets are contiguous to each other, lie in a common plane and are of alternating polarity; and a magnetoresistive element which is formed of at least two ferromagnetic film strips arranged substantially perpendicular to each other to define perpendicular main current conducting paths, the strips being disposed on a substrate which is parallel with and adjacent to the pole faces, whereby a bias flux is applied to the magnetoresistive element from the stationary bias magnet at a predetermined angle.

In one application of this invention, the magnetic field to be detected is applied to the magnetoresistive element from, for example, a rotary magnet which is magnetized in the direction of its thickness, the applied field being at an angle other than the predetermined angle. In the magnetoresistive device, a composite flux consisting of the bias flux from the bias magnet and the signal flux from the rotary magnet is applied to the magnetoresistive element. Preferably, the intensity of the composite flux is sufficient to saturate the ferromagnetic film strips. Accordingly, the flux intensity of either magnet need not be so high as to cause saturation by itself. For example, when the signal flux is perpendicular to the bias flux, the flux intensity of each magnet may be merely $1/\sqrt{2}$ of the flux intensity (40~50 oersteds) required to saturate the magnetoresistive element. Since the fluxes are applied to the magnetoresistive element in parallel with the surface of the ferromagnetic metal strips, the entirety of the strips can be disposed in a uniform magnetic field if the surface area of the magnetoresistive element is sufficiently small. Accordingly, the optimum output signal can be obtained from the magnetoresistive element.

Since the surface of the ferromagnetic metal strips is arranged in parallel with the pole faces of the bias and supply magnets, in one embodiment plural magnetoresistive elements can be advantageously formed on one insulating substrate. By the present invention, even if the direction and magnitude of the signal flux and bias flux are varied or somewhat deviated, the output of the magnetoresistive element is substantially unaffected.

BRIEF DESCRIPTION OF THE DRAWINGS

The following detailed description will best be understood in conjunction with the accompanying drawings, wherein:

FIGS. 6A and 6B are plan and cross-sectional views showing the positional relationship between the magnetoresistive element and a stationary bias magnet according to one embodiment of this invention;

FIGS. 7A and 7B are plan and cross-sectional views showing a rotary magnet which can be used in one embodiment of this invention;

DESCRIPTION OF THE PREFERRED EMBODIMENTS

Figure 1:
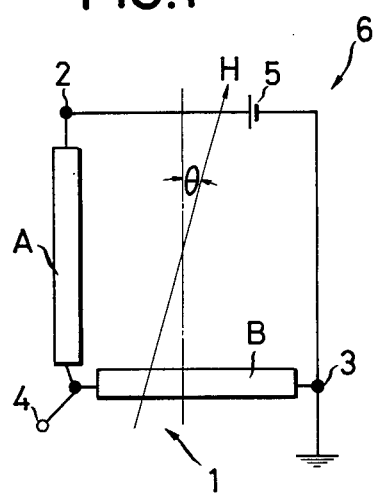
FIG. 1 is a schematic view illustrating the principles of operation of a magnetoresistive element as applied to this invention.

Referring now to the drawings, wherein like reference numerals are used throughout, and in particular to FIG. 1, there is shown a magnetoresistive element 1 which is comprised of a pair of strips A and B formed of a ferromagnetic material having a magnetoresistive effect. The longitudinal direction of the strip A is perpendicular to that of strip B. The strips A and B are connected electrically to each other in series. Current supply terminals 2 and 3 are connected to the opposed ends of the strips A and B. An output terminal 4 is connected to the junction defined by the series connection of the strips. A power source 5 is connected between the current supply terminals 2 and 3. One current supply terminal 3 is connected to a reference potential, such as ground. The resultant magnetoresistive element forms a sensing circuit 6 for detecting magnetic fields.

Let it be assumed that a magnetic field H having an intensity sufficient to saturate the strips A and B is applied to the strips at an angle $\theta$ relative to the longitudinal direction of the strip A. Generally, the resistance of a saturated ferromagnetic material is anisotropic. That is, the resistance of such a material is greater in the direction of magnetization than in the direction perpendicular thereto. Accordingly, resistances $\rho_A$ and $\rho_B$ of the strips A and B can be represented by the Voigt-Thomson formula:

$$\rho_A(\theta) = \rho_\perp \sin^2\theta + \rho_\parallel \cos^2\theta \tag{1}$$

$$\rho_B(\theta) = \rho_\perp \cos^2\theta + \rho_\parallel \sin^2\theta \tag{2}$$

where $\rho_\perp$ is the resistance of the ferromagnetic strip A or B when saturated with a magnetic field perpendicular to the longitudinal direction of the strip, and $\rho_\parallel$ is the resistance of the ferromagnetic strip when saturated with a magnetic field parallel with the longitudinal direction of the strip.

Figure 2:
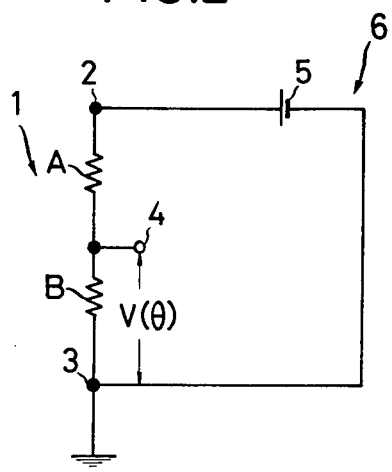
FIG. 2 is an equivalent circuit diagram of FIG. 1.

FIG. 2 represents an equivalent circuit of the magnetoresistive element shown in FIG. 1. A voltage $V(\theta)$ at the output terminal 4 will be derived by voltage division and is represented by $$V(\theta) = \frac{\rho_B(\theta)}{\rho_A(\theta) + \rho_B(\theta)} \cdot V_o \tag{3}$$

where $V_o$ is the voltage of the power source 5.

By substitution of equations (1) and (2) into equation (3), and by rearranging terms, $$V(\theta) = \frac{V_o}{2} - \frac{\Delta\rho \cos 2\theta}{2(\rho_\parallel + \rho_\perp)} \cdot V_o \quad (4)$$

where $\Delta\rho = \rho_\parallel - \rho_\perp$.

In equation (4), the first term represents a constant voltage $V_s$ which is a function of the power source ($V_s = V_o/2$), and the second term represents a change or deviation from the constant voltage, attributed to the influence of the magnetic field H. This change in the output voltage is represented as $V(\theta)$. If the resistance of the ferromagnetic strip A or B in the absence of the field H is expressed as $\rho_o$, and if $2\rho_o = \rho_\parallel + \rho_\perp$, then $\Delta V(\theta)$ can be rewritten as $$\Delta V(\theta) = -\frac{\Delta\rho}{4\rho_o} \cdot \cos 2\theta \cdot V_o \quad (5)$$

It is appreciated, from equation (5), that $V(\theta)$ is a maximum positive or negative value, that is, the absolute value of the change of the output voltage is maximum, at angles $\theta$ of 0°, 90°, 180° and 270°, where $\cos 2\theta$ is $\pm 1$.

One embodiment of the magnetoresistive element 1 wherein the above equations are satisfied now will be described with reference to FIG. 3. A thin film of ferromagnetic material is deposited, as by a conventional vacuum evaporation technique, for example, on an insulating substrate 7, to a depth of approximately 600 to 1,000 A. Typical examples of the substrate 7 are a glass slide, a photographic dry plate, or the like. Other suitable materials can be used. Then, the thin film is etched so as to form the ferromagnetic strips A and B in zig-zag or serpentine configuration, as shown, or in strips, together with the terminals 2, 3 and 4. The ferromagnetic strips A and B comprise a plurality of main current conducting paths 8 and 9 and associated connecting portions 10 and 11, respectively. The main current paths 8 and 9 are substantially perpendicular to each other. As viewed in FIG. 3, the strips A are capable of conducting current predominantly in the vertical direction, or course, the strips B are capable of conducting current predominantly in the horizontal direction, or course. Of course, as is realized, other mutually perpendicular current conducting directions can be employed. The last path 3a of the main current path 8 is connected to the first path 9a of the main current path 9 in series. The connecting junction defined by the last path 8a and the first path 9a is connected to the terminal 4.

Figure 3:
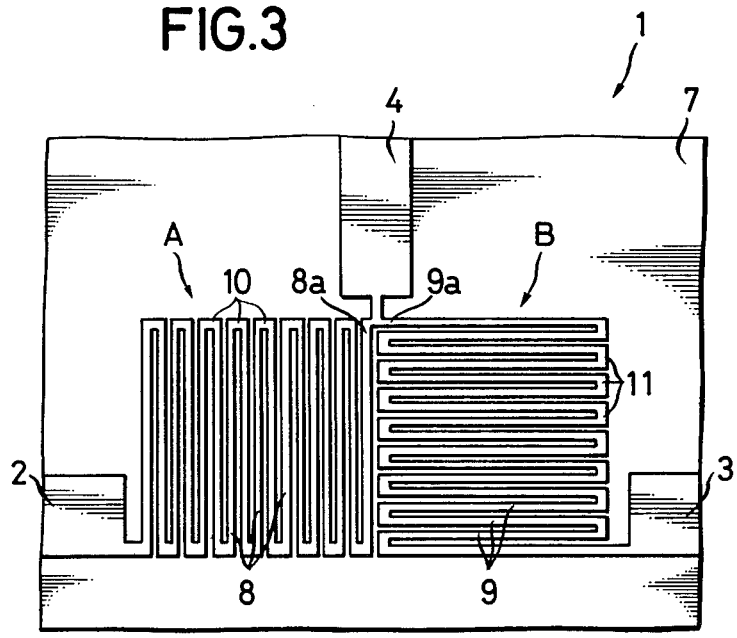
FIG. 3 is a plan view of a magnetoresistive element which can be used in one embodiment of the invention.

By reason of the arrangement illustrated in FIG. 3, the effective length, and therefore, the resistance, of the magnetoresistive element 1 can be increased. At the same time, the overall size of the magnetoresistive element can be minimized. Consequently, the amount of power consumed can be reduced and the change of the output voltage $V(\theta)$ can be increased, these conditions being particularly advantageous.

Figure 4:
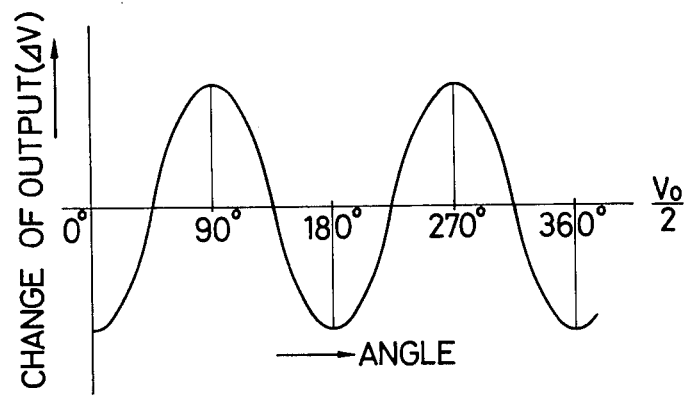
FIG. 4 is a graph illustrating the relationship between change of output voltage of the magnetoresistive element and the direction of magnetic field applied to the element.

The manner in which the magnetoresistive element is used in the present invention now will be described. Equation (4) can be graphically depicted as shown in FIG. 4. As is apparent, the output $V(\theta)$ of the magnetoresistive element is equal to $V_o/2$ when the magnetic field H is applied to the strips at an angle $\theta = 45°$. That is, $V(\theta) = 0$ because at $\theta = 45°$, $\cos 2\theta = 0$. Also, the output voltage $V(\theta)$ is minimum and maximum at angles $\theta = 0°$ and 90° respectively.

Figure 5A:
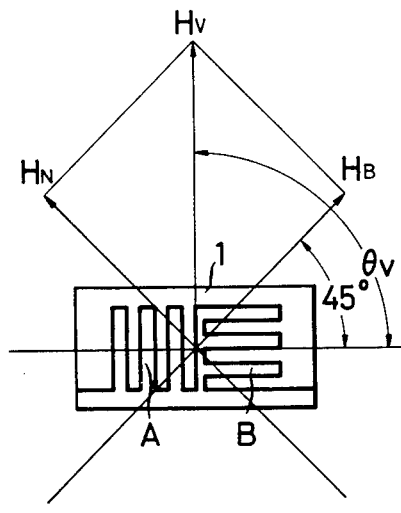
FIGS. 5A and 5B are schematic views illustrating examples of magnetic fields applied to the magnetoresistive element according to this invention.

In order to obtain the maximum output from the magnetoresistive element, a stationary bias flux having a field $H_B$ is applied to the magnetoresistive element at an angle $\theta = 45°$. Let it be assumed that a signal flux having a field $H_N$ is applied to the magnetoresistive element in a direction preferably perpendicular to the stationary bias flux field $H_B$, as shown in FIG. 5A. A composite field constituted by the bias and signal fields will have a direction $\theta_V$ and a magnitude $H_V$. The angle $\theta_V$ of the composite field and the magnitude thereof can be expressed as:

$$\theta_V = \tan^{-1} \frac{|H_N|}{|H_B|} + 45° \quad (5)$$

and $$H_V = \sqrt{H_B^2 + H_N^2} \quad (6)$$

If the bias and signal fields are of equal intensity, $H_N = H_B$, then $\theta_V = 90°$, and the composite field intensity $H_V$ is $H_V = (\sqrt{2} H_B) = (\sqrt{2} H_N)$.

Figure 5B:
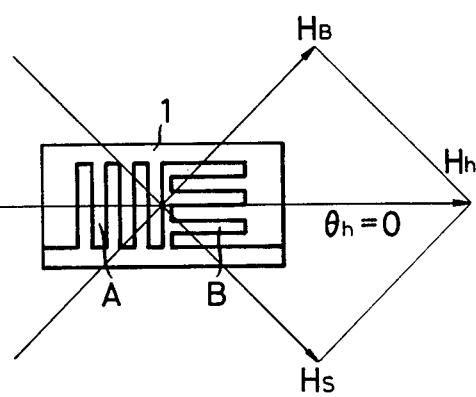

Let it now be assumed that, as shown in FIG. 5B, the signal flux having a field $H_S$ is applied to the magnetoresistive element 1 in a direction opposite to that of the signal $H_N$. The composite field constituted by these bias and signal fields now will have a direction $\theta_h$ and a magnitude $H_h$. The angle $\theta_h$ and the intensity $H_h$ of the composite flux can be expressed by:

$$\theta_h = \tan^{-1} \frac{|H_S|}{|H_B|} - 45° \quad (7)$$

$$H_h = \sqrt{H_B^2 + H_S^2} \quad (8)$$

If the bias and signal fields are of equal intensity, $H_S = H_B$, then $\theta_h = 0°$, and the composite field intensity $H_h$ is $H_h = (\sqrt{2} H_B) = (\sqrt{2} H_S)$.

Referring now to FIGS 6A and 6B, one embodiment of a device having a magnetoresistive element supplied with a stationary bias flux having a field $H_B$, and serving to detect the signal fluxes $H_N$, $H_S$, will be described. FIG. 6A shows the positional relationship between each of three magnetoresistive elements 1a, 1b and 1c and a stationary bias magnet 12. FIG. 6B is a cross-sectional view taken along the line VIB – BIV. The stationary bias magnet 12 is, in one example, a disc formed of plastic magnetic material, such as magnetic powder dispersed in a polyester, which is magnetized in the direction of its thickness. That is, as viewed in FIG. 6A, the upper surface of portions of the magnet is of one polarity and the lower surface of the same portions exhibits the opposite polarity. In one embodiment, bias magnet 12 is circular and is formed of a propeller-shaped section, the blades of which are interleaved with fan-shaped sections. At the upper surface, the N-poles are formed at the propeller blades and the S-poles are adjacent to and alternate with the N-poles. In the lower surface of the stationary bias magnet 12, N-poles and S-poles are formed opposite to the S-poles and the N-poles of the illustrated upper surface, respectively. Thus, a stationary bias flux is generated across each boundary between contiguous N-pole and S-pole faces, as shown by the arrows $H_B$. The three magnetoresistive elements 1a, 1b and 1c are arranged adjacent to the stationary bias magnet 12 at regular angular intervals of 120° at selected boundaries, as shown. The surfaces of the ferromagnetic metal strips A and B of the three magnetoresistive elements 1a, 1b and 1c, and thus the surfaces of the substrates, are parallel with the surface of the stationary bias magnet 12, i.e., the pole faces. The three magnetoresistive elements 1a, 1b and 1c are disposed at angles with respect to the boundary lines between the N-pole and the S-pole faces so that the stationary bias flux $H_B$ is applied to each of the three magnetoresistive elements at an angle of 45° with respect to a current conducting path, such as path 8. The bias field is applied in parallel with the strips A and B.

FIG. 7A is a plan view of a rotary magnet 13 which is adapted to supply a signal flux, and which can be mounted on a rotary member to thus permit detection of the position thereof. FIG. 7B is a cross-sectional view taken along the line VIIB - VIIB. The rotary magnet 13 is disc-shaped and is formed of a circular plastic magnetic material which is magnetized in the direction of its thickness. It is appreciated that the magnet 13 is similar to the bias magnet 12 and thus is formed with pole faces which are disposed in a surface plane of the magnet 13 so as to produce a magnetic field $H_S$, $H_N$, corresponding to the aforementioned signal field, transversely of the magnet pole faces and adapted to be applied to the magnetoresistive elements 1a, 1b and 1c in parallel to their respective substrates. As shown, the configuration of the magnet 13 in the illustrated embodiment differs from that of magnet 12 of FIGS. 6A and B. That is, the rotary magnet 13 is circular and here is formed of two sets or pairs of semi-annular magnets of opposite polarity. The pairs are concentric with each other. Hence, a boundary is formed between the contiguous N-pole and S-pole faces of the outer annular pair and a boundary is formed between the S-pole and N-pole faces of the inner annular pair. Also, boundaries are established between the concentric semi-annular pole faces N and S as well as between pole faces S and N shown in the left-hand and right-hand portions, respectively, of the FIGURE.

Figure 8:
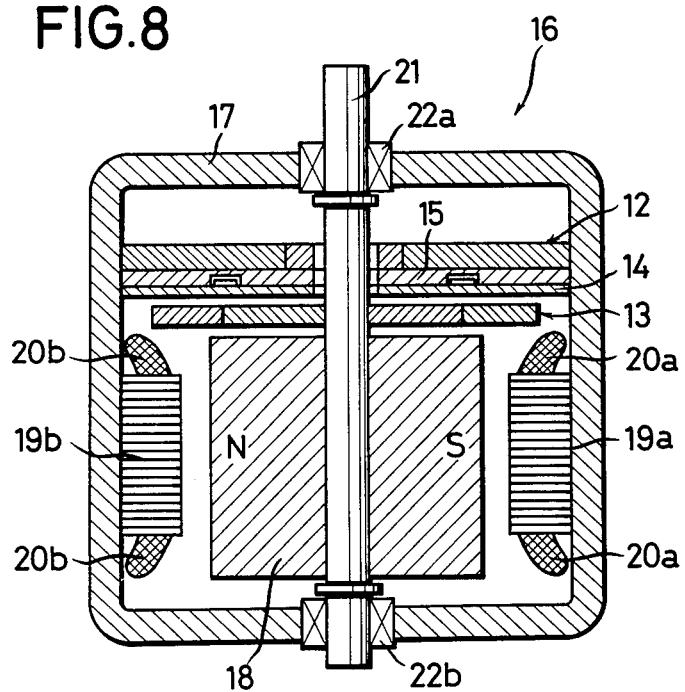
FIG. 8 is a cross-sectional view showing one embodiment of a brushless motor in which the magnetoresistive element according to this invention finds application.

Turning now to FIG. 8, there is illustrated one embodiment of a brushless motor 16 including a rotor position detector comprised of the three magnetoresistive elements 1a, 1b and 1c. In this embodiment, the stationary bias magnet 12 and the rotary signal magnet 13 are concentric of each other and are disposed in face-to-face relation in spaced apart, parallel planes. The three magnetoresistive elements 1a, 1b and 1c are positioned intermediate the stationary bias magnet 12 and the rotary signal magnet 13 so that the surfaces of the ferromagnetic metal strips A and B of the three magnetoresistive elements 1a, 1b and 1c are in and parallel with the magnetic fields produced by both magnets. The magnetoresistive elements are mounted on a printed circuit board 14 and are fixed in position by synthetic resin 15. The printed circuit board 14 is fixed to a case 17 of the brushless motor 16. A permanent magnet rotor 18 is mounted on a rotor shaft 21, facing field poles 19a and 19b in the motor case 17. Drive coils 20a and 20b are wound on the field poles 19a and 19b. The rotor shaft 21 is rotatably supported on bearings 22a and 22b and also supports the rotary signal magnet 13.

The signal fluxes $H_N$ and $H_S$ as shown in FIGS. 7A and 7B are applied to the magnetoresistive elements 1a, 1b and 1c from the rotary magnet 13. When the rotary magnet 13 is rotated with the rotor shaft 21 in the embodiment shown in FIG. 8, the signal fluxes $H_N$ and $H_S$ are applied alternately to each of the three magnetoresistive elements 1a, 1b and 1c. Accordingly, composite fluxes $H_V$ and $H_h$, which are resultant vectors constituted by the stationary bias flux $H_B$ and the signal fuxes $H_N$, $H_S$ and similar to the composite fluxes depicted in FIGS. 5A and B, are alternately applied to the magnetoresistive elements.

If the combination of the stationary magnet 12 shown in FIGS. 6A and 6B and the rotary magnet 13 shown in FIGS. 7A and 7B is considered, then, while the composite flux $H_V$ is applied to one magnetoresistive element, for example, element 1a, the composite flux $H_h$ is applied to the other magnetoresistive elements 1b and 1c. Accordingly, when the signal flux $H_N$ is applied to the element 1a at an angle of 90° with respect to the bias flux $H_B$ (so that $\theta_V = 90°$), the maximum output is obtained from the magnetoresistive element 1a. At the same time, the signal flux $H_S$ is applied to the elements 1b and 1c at an angle of $-90°$ with respect to the bias flux $H_B$ (so that $\theta_h = 0°$) whereby the minimum output is obtained from the magnetoresistive elements 1b and 1c (see FIGS. 4 and 5A and 5B). The maximum output and the minimum outputs are alternately obtained from the magnetoresistive elements 1a, 1b and 1c and thus are functions of the angular position of the rotor shaft as the rotary magnet 13 rotates. Hence, corresponding pulse outputs can be obtained from the magnetoresistive elements 1a, 1b and 1c.

In view of the foregoing basis of operation upon which the present invention proceeds, it is apparent that the arrangement of the magnet poles of the stationary bias magnet 12 and the rotary signal magnet 13, magnetized in the directions of their thickness, is not limited to the embodiments of FIGS. 6A and 6B, and FIGS. 7A and 7B. Various modifications and changes are envisaged.

Figure 9:
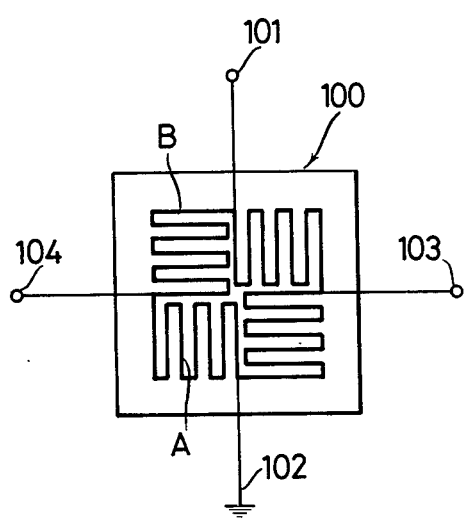
FIG. 9 is another embodiment of the magnetoresistive element which can be used with this invention.

FIG. 9 shows another embodiment of a magnetoresistive element which can be used with this invention. In this embodiment, the magnetoresistive element 100 is comprised of two pairs of ferromagnetic metal strips A and B which are connected to each other in the form of a bridge. The two pairs of ferromagnetic metal strips A and B are deposited on a common insulating substrate. Current supply terminals 101 and 102, and output terminals 103 and 104, are connected to the magnetoresistive element 100 as schematically depicted.

When the magnetoresistive element 100 is used to detect a magnetic field, the output signals produced at the output terminals 103 and 104 are oppositely phased. Accordingly, it is sufficient merely to use one or the other output terminal in many applications, depending upon the desired polarity of the output signal. As one example, the output signal from, for instance, output terminal 104, may be inverted in phase and then added to the output signal from output terminal 103 to produce a resultant output of given polarity but twice the normal amplitude. Of course, if desired, the output signal from the terminal 103 can be phase inverted and added to the output signal from the terminal 104.

Figure 10:
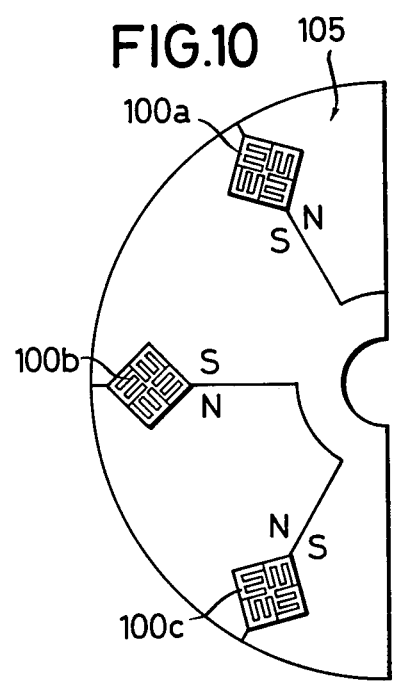
FIG. 10 is a plan view showing the positional relationship between a stationary bias magnet and the magnetoresistive element shown in FIG. 9 and according to another embodiment of this invention.

FIG. 10 shows another embodiment of a stationary bias magnet which can be used to supply a bias field to the magnetoresistive elements 100. A disc-shaped stationary bias magnet 105, magnetized in the direction of its thickness, is here shown to be semi-circular and is formed with alternating pole faces on the upper surface, as viewed. Three magnetoresistive elements 100a, 100b and 100c are positioned adjacent to the stationary bias magnet 105 and are angularly separated by 60° so as to be disposed at each of the boundaries of the pole faces of the bias magnet. Moreover, the elements each are angled with respect to the boundaries by 45°, and the bridge outputs of the magnetoresistive elements are derived from the output terminals 103 and 104 in opposite polarities. The embodiment of FIG. 10 can perform an operation equivalent to that of the embodiment of FIG. 6A in which the three magnetoresistive elements 1a, 1b and 1c are arranged adjacent the bias magnet at regular angular intervals of 120°. If the FIG. 10 configuration is used, the three magnetoresistive elements 100a, 100b and 100c can be mounted on a printed circuit board to facilitate power supply and output signal processing, and to minimize the amount of requisite space therefor, thus attaining a favorable space factor.

Figure 11B:
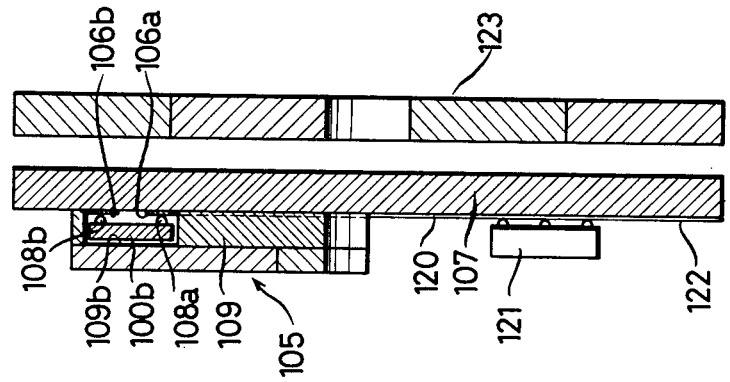
FIGS. 11A and 11B are plan and cross-sectional views showing the magnetoresistive element mounted on a printed circuit board in accordance with yet another embodiment of this invention.
Figure 11A:
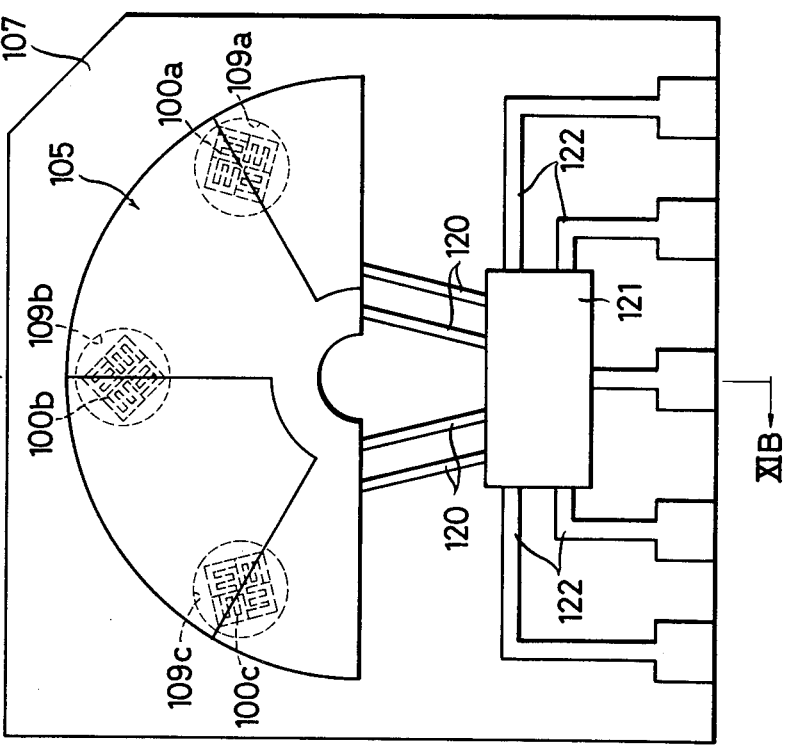

A position detector employing the magnetoresistive apparatus of FIG. 10 now will be described with reference to FIGS. 11A and 11B. FIG. 11A is a plan view of the magnetoresistive device and FIG. 11B is a cross-sectional view taken along the line XIB — XIB of FIG. 11A. Conductors forming wiring patterns 106a and 106b are deposited on a ceramic base plate 107. The conductors may be etched or otherwise formed on the plate 107 in accordance with conventional techniques. The magnetoresistive elements 100a, 100b and 100c are fixedly positioned at predetermined locations on the ceramic base plate 107 by any typical process, such as the face-down bonding method. Thus, the terminals 101, 102, 103 and 104 of each of the magnetoresistive elements 100a, 100b and 100c are electrically connected to the wiring patterns 106a and 106b through bonds 108a and 108b as shown more clearly in FIG. 11B.

The stationary bias magnet 105 is fixed to the ceramic base plate 107 through a spacer 109. The spacer may be formed of an acryl resin, and have the shape of a semicircle, corresponding to the shape of the stationary bias magnet 105. Holes or cut-outs 109a, 109b and 109c for accomodating the magnetoresistive elements 100a, 100b and 100c are provided in the spacer 109. Additional conductors forming wiring patterns 120, connected to the wiring patterns 106a, and 106b, are deposited on the base plate 107, and are further connected to an integrated circuit 121 which may include a wave-shaping circuit, an amplifier, or other signal processing circuit. Further conductors forming wiring patterns 122 are led out from the circuit 121 for transmitting the output of the circuit 121 to further apparatus and connecting the circuit to a suitable power source.

As seen in FIG. 11B, a rotary magnet 123, which may be similar to the signal magnet 13 previously described with respect to FIG. 7A, is spaced from the base plate 107 by a predetermined distance, and is parallel thereto. The rotary magnet 123 rotates with any member whose position is to be detected and, in one application, is fixed, for example, to the rotor shaft of a brushless motor. The operation of the FIG. 11B embodiment is similar to the aforedescribed operation of other embodiments of this invention and, therefore, in the interest of brevity, is not described here.

Although illustrative embodiments of this invention have been described in detail herein with reference to the accompanying drawings, it is to be understood that the invention is not limited to those precise embodiments, and that various changes and modifications may be effected therein by one skilled in the art without departing from the spirit and scope of the novel concepts of this invention, as defined in the appended claims. Furthermore, the particular application of this invention to detecting the angular position of a rotor is merely one example, and should not be construed as limiting this invention thereto. It should now be apparent that the present invention can be used to detect the direction of a magnetic field for any purpose contemplated.

What is claimed is:

1. Apparatus for detecting the direction of an external rotary magnetic field comprising in combination:

a magnetoresistive element having an insulating substrate, a first set of substantially longitudinal ferromagnetic metal film strips disposed in serpentine configuration on said substrate for providing a first main current conducting path, a second set of substantially longitudinal ferromagnetic metal film strips disposed in serpentine configuration on said substrate perpendicular to said first set of film strips for providing a second main current conducting path perpendicular to said first main current conducting path, a first end of said first set of strips being electrically connected to a first end of said second set of strips to define a junction, a first current supply terminal connected to the opposite end of said first set of strips and a second current supply terminal connected to the opposite end of said second set of strips, and an output terminal connected to said junction between said strips for supplying an output signal;

a stationary bias magnet located adjacent to said magnetoresistive element for supplying a bias field thereto at a predetermined angle relative to one of said current conducting paths, said bias field being parallel to the plane of said substrate; and said magnetoresistive element being positionable in said external field so that said external rotary magnetic field is applied to said element parallel to the plane of said substrate at an angle $\theta$ relative to one of said current conducting paths, wherein $\theta$ varies from 0° to 360°, thereby providing a composite magnetic field at said element with a component due to said bias field and a component due to said external rotary field for causing said output signal to vary as a function of $\theta$.

2. Apparatus according to claim 1, wherein said predetermined angle is at 45° relative to said one current conducting path.

3. Apparatus according to claim 1 further comprising a printed circuit board, and wherein said magnetoresistive element is mounted on said printed circuit board and is fixedly positioned thereon with a synthetic resin.

4. Apparatus for detecting the direction of a magnetic field comprising in combination:

a magnetoresistive element having an insulating substrate, first and second ferromagnetic metal film strips on said substrate for providing first and second main current conducting paths respectively perpendicular to each other, first ends of said strips being electrically connected together to define a junction, current supply terminals connected to the opposite ends of said strips and an output terminal connected to said junction between said strips for supplying an output signal; and a stationary bias magnet for supplying a bias field to said magnetoresistive element at a predetermined angle relative to one of said current conducting paths, said bias magnet being located adjacent to said element, and wherein the magnetic field whose direction is detected is produced by a rotary magnet mounted on and rotated with a rotating shaft, said rotary magnet supplying a magnetic flux to said magnetoresistive element responsive to the angular position of said rotating shaft wherein the output signal from said magnetoresistive element is a function of the resultant vector between the magnetic fluxes of said stationary bias magnet and said rotary magnet.

5. Apparatus according to claim 4, wherein said rotary magnet is adjacent to said magnetoresistive element and supplies the magnetic flux thereto in parallel with said substrate.

6. Apparatus according to claim 5 wherein said magnetoresistive element is disposed between said stationary bias magnet and said rotary magnet.

7. Apparatus according to claim 4 wherein said bias magnet is disc-shaped and is magnetized in the direction of its thickness, the plane of said bias magnet being parallel to said magnetoresistive element and having opposite magnetic poles positioned on a surface thereof, at least one magnetoresistive element being adjacent a boundary defined by two adjacent opposite magnetic poles.

8. Apparatus for detecting the direction of an applied rotary magnetic field comprising:

a magnetoresistive element disposed on an insulating substrate, said element comprising a first set of ferromagnetic strips disposed in serpentine configuration on said substrate for conducting current along substantially a first course, a second set of ferromagnetic strips disposed in serpentine configuration on said substrate for conducting current along substantially a second course perpendicular to said first course, said at first set of ferromagnetic strips being connected in series with said second set of ferromagnetic strips to define a junction therebetween from which an output signal is derived;

a bias magnet for supplying a bias field to said magnetoresistive element in parallel with said substrate and at a predetermined angle with respect to said first current conducting course; and a signal supply magnet for supplying said applied magnetic field to said magnetoresistive element in parallel with said substrate and at an angle $\theta$ with respect to one of said current conducting courses, wherein $\theta$ varies from 0° to 360°, the composite field produced by said bias and signal supply magnets having sufficient strength to saturate said ferromagnetic strips and having a direction to cause said output signal to vary as a function of $\theta$.

9. Apparatus for detecting the direction of an applied magnetic field comprising:

a magnetoresistive element disposed on an insulating substrate, said element comprising at least one ferromagnetic strip on said substrate for conducting current along substantially a first course, at least a second ferromagnetic strip on said substrate for conducting current along substantially a second course perpendicular to said first course, said at least one ferromagnetic strip being connected in series with said at least a second ferromagnetic strip to define a junction therebetween from which an output signal is derived;

a bias magnet for supplying a bias field to said magnetoresistive element in parallel with said substrate and at a predetermined angle with respect to said first current conducting course; said bias magnet being formed of contiguous north and south pole faces substantially parallel to said substrate; and a signal supply magnet for supplying said applied magnetic field to said magnetoresistive element in parallel with said substrate, the composite field produced by said bias and signal supply magnets having sufficient strength to saturate said ferromagnetic strips and having a direction, whereby said output signal is a function of said direction.

10. Apparatus according to claim 9 wherein said bias magnet is disposed adjacent said magnetoresistive element, said element being positioned at the boundary defined by said contiguous pole faces, the boundary being at said predetermined angle with respect to said first current conducting course.

11. Apparatus for detecting the direction of an applied magnetic field comprising:

a magnetoresistive element disposed on an insulating substrate, said element comprising at least one ferromagnetic strip on said substrate for conducting current along substantially a first course, at least a second ferromagnetic strip on said substrate for conducting current along substantially a second course perpendicular to said first course, said at least one ferromagnetic strip being connected in series with said at least a second ferromagnetic strip to define a junction therebetween from which an output signal is derived;

a bias magnet for supplying a bias field to said magnetoresistive element in parallel with said substrate and at a predetermined angle with respect to said first current conducting course; and a signal supply magnet for supplying said applied magnetic field to said magnetoresistive element in parallel with said substrate, said signal supply magnet being comprised of contiguous north and south pole faces substantially parallel to said substrate and rotatable with respect to said magnetoresistive element, the composite field produced by said bias and signal supply magnets having sufficient strength to saturate said ferromagnetic strips and having a direction, whereby said output signal is a function of said direction.

12. Apparatus for detecting the position of a rotary member, comprising:

a bias magnet for supplying a bias field, said bias magnet forming at least a portion of a disc and having contiguous, alternating polarity pole faces in a first plane to produce said bias field transversely of the respective boundaries defined by said contiguous pole faces;

plural magnetoresistive elements, each disposed on an insulating substrate and comprising first and second ferromagnetic film strips on said substrate for providing first and second main current conducting paths respectively perpendicular to each other, said strips being connected in series to define a junction therebetween from which an output signal is derived and having current supply terminals, said plural magnetoresistive elements being positioned adjacent at least some of said boundaries defined by said contiguous pole faces whereat the insulating substrates are substantially parallel to said first plane and said elements are disposed at an angle to said respective boundaries so that said bias field is parallel to said respective substrates and at a predetermined angle with respect to one of said current conducting paths; and a rotary member adjacent said plural magnetoresistive elements and comprised of a supply magnet having at least two contiguous opposite polarity pole faces in a second plane parallel to said first plane to produce a signal field transversely of said pole faces, said supply magnet being rotatable so that said signal field rotates with respect to said magnetoresistive elements;

said bias and supply fields producing a composite field having a rotating component, whereby said output signal is a function of said rotating component.

13. Apparatus according to claim 12 wherein said bias magnet is circular and is stationary and said magnetoresistive elements are positioned adjacent selected ones of said boundaries in said bias magnet.

14. Apparatus according to claim 12 wherein said bias magnet is a sector of a circle and is stationary.

15. Apparatus according to claim 14 further comprising a common circuit board, and wherein said magnetoresistive elements are mounted on said common circuit board and said bias magnet is mounted on said circuit board in overlying relation to said elements, the junctions and current supply terminals of said magnetoresistive elements being in contact with current conductors on said circuit board.

16. Apparatus according to claim 12 wherein said supply magnet is circular and is comprised of a first set of alternating polarity pole faces in said second plane and a second set of alternating polarity pole faces concentric with said first set, whereby a boundary between a pole face in said first set and an opposite polarity pole face in said second set is arcuate.

17. Apparatus according to claim 16 wherein said first and second sets of pole faces each are formed of two pole faces.

* * * * *